(12) United States Patent
Akram

(10) Patent No.: US 7,517,797 B2
(45) Date of Patent: Apr. 14, 2009

(54) CARRIER FOR WAFER-SCALE PACKAGE, WAFER-SCALE PACKAGE INCLUDING THE CARRIER, AND METHODS

(75) Inventor: Salman Akram, Boise, ID (US)

(73) Assignee: Micron Technology, Inc., Boise, ID (US)

(*) Notice: Subject to any disclaimer, the term of this patent is extended or adjusted under 35 U.S.C. 154(b) by 449 days.

(21) Appl. No.: 10/200,793

(22) Filed: Jul. 22, 2002

(65) Prior Publication Data
US 2002/0182771 A1    Dec. 5, 2002

Related U.S. Application Data

(62) Division of application No. 09/652,495, filed on Aug. 31, 2000, now Pat. No. 7,271,491.

(51) Int. Cl.
*H01L 21/44* (2006.01)
(52) U.S. Cl. ........................ 438/667; 438/108
(58) Field of Classification Search ......... 438/612–614, 438/618, 666, 629, 637, 639, 640, 667–668, 438/672, 675, 700–701, 713, 978, 109–110, 438/108, 125–127, 113, 458, 464, 118–119, 438/112; 257/779, 691, 698, 737–738, 780, 257/787, 686, 108, 113, 127, 613, 614, 109, 257/110, 458, 464, 618, 118, 119, 778, 774, 257/685, 621
See application file for complete search history.

(56) References Cited

U.S. PATENT DOCUMENTS

| | | | |
|---|---|---|---|
| 4,830,264 A * | 5/1989 | Bitaillou et al. ........ | 228/180.21 |
| 5,185,295 A | 2/1993 | Goto et al. | |
| 5,229,647 A | 7/1993 | Gnadinger | |
| 5,258,648 A | 11/1993 | Lin | |
| 5,291,438 A * | 3/1994 | Witek et al. .................. | 365/149 |
| 5,418,687 A | 5/1995 | Chen | |
| 5,440,241 A | 8/1995 | King et al. | |
| 5,506,383 A | 4/1996 | Chen | |
| 5,682,062 A | 10/1997 | Gaul | |
| 5,685,885 A | 11/1997 | Khandros et al. | |
| 5,742,100 A | 4/1998 | Schroeder et al. | |
| 5,767,575 A | 6/1998 | Lan et al. | |
| 5,870,289 A | 2/1999 | Tokuda et al. | |

(Continued)

FOREIGN PATENT DOCUMENTS

JP          63-157430          *   6/1988

*Primary Examiner*—A. Sefer
*Assistant Examiner*—Dilinh P Nguyen
(74) *Attorney, Agent, or Firm*—TraskBritt

(57) ABSTRACT

A carrier for use in a chip-scale package includes a semiconductor substrate with a plurality of apertures formed therethrough. The apertures of the carrier are aligned with bond pads of a semiconductor device. Conductive material is introduced into each of the apertures of the carrier to form vias therein that establish electrical communication between the bond pads of the semiconductor device and conductive traces that extend to the vias or contacts or conductive structures that are subsequently formed directly over the vias or at opposite ends of the conductive traces. Such chip-scale packages may be formed on a wafer-scale, in which case individual chip-scale packages are singulated from one another at some point during or following the packaging process.

25 Claims, 6 Drawing Sheets

U.S. PATENT DOCUMENTS

| | | | |
|---|---|---|---|
| 5,892,288 A * | 4/1999 | Muraki et al. | 257/778 |
| 5,940,679 A * | 8/1999 | Tomura et al. | |
| 5,946,555 A | 8/1999 | Crumly et al. | |
| 5,949,140 A * | 9/1999 | Nishi et al. | 257/728 |
| 5,973,396 A | 10/1999 | Farnworth | |
| 5,990,546 A | 11/1999 | Igarashi et al. | |
| 6,004,867 A * | 12/1999 | Kim et al. | 438/459 |
| 6,037,665 A * | 3/2000 | Miyazaki | 257/773 |
| 6,064,114 A * | 5/2000 | Higgins, III | 257/698 |
| 6,114,187 A * | 9/2000 | Hayes | 438/106 |
| 6,197,613 B1 * | 3/2001 | Kung et al. | |
| 6,228,687 B1 * | 5/2001 | Akram et al. | 438/125 |
| 6,291,272 B1 * | 9/2001 | Giri et al. | 438/121 |
| 6,294,405 B1 | 9/2001 | Higgins, III | |
| 6,297,553 B1 * | 10/2001 | Horiuchi et al. | 257/737 |
| 6,392,296 B1 | 5/2002 | Ahn et al. | |
| 6,440,771 B1 | 8/2002 | Pierce | |
| 6,455,354 B1 * | 9/2002 | Jiang | 438/118 |
| 6,458,623 B1 | 10/2002 | Goldmann et al. | |
| 6,809,421 B1 * | 10/2004 | Hayasaka et al. | 257/777 |
| 6,955,870 B2 | 10/2005 | Kohno et al. | |
| 2003/0038378 A1 | 2/2003 | Jacobs | |

* cited by examiner

CARRIER FOR WAFER-SCALE PACKAGE, WAFER-SCALE PACKAGE INCLUDING THE CARRIER, AND METHODS

CROSS-REFERENCE TO RELATED APPLICATION

This application is a divisional of application Ser. No. 09/652,495, filed Aug. 31, 2000, now U.S. Pat. No. 7,271,491, issued Sep. 18, 2007.

BACKGROUND OF THE INVENTION

1. Field of the Invention

The present invention relates to carrier substrates for use in chip-scale packages and to chip-scale packages including such carrier substrates. Particularly, the present invention relates to silicon carrier substrates. Methods of fabricating chip-scale packages are also within the scope of the present invention.

2. State of the Art

In conventional semiconductor device fabrication processes, a number of distinct semiconductor devices, such as memory chips or microprocessors, are fabricated on a semiconductor substrate, such as a silicon wafer. After the desired structures, circuitry, and other features of each of the semiconductor devices have been fabricated upon the semiconductor substrate, the substrate is typically singulated to separate the individual semiconductor devices from one another.

Various post-fabrication processes, such as testing the circuits of each of the semiconductor devices and burn-in processes, may be employed either prior to or following singulation of the semiconductor substrate. These post-fabrication processes may be employed to impart the semiconductor devices with their intended functionality and to determine whether or not each of the individual semiconductor devices meet quality control specifications.

The individual semiconductor devices may then be packaged. Along with the trend in the semiconductor industry to decrease semiconductor device size and increase the density of structures of semiconductor devices, package sizes are also ever-decreasing. One type of semiconductor device package, the so-called "chip-scale package" or "chip-sized package" ("CSP"), consumes about the same amount of real estate upon a substrate as the bare semiconductor device itself. Such chip-scale packages typically include a carrier substrate having roughly the same surface area as the semiconductor device itself. As the carrier substrate of such chip-scale packages is small, electrical connections between the semiconductor device and the carrier substrate are often made by flip-chip type bonds or tape-automated bonding ("TAB"). Due to the typical use of a carrier substrate that has a different coefficient of thermal expansion than the semiconductor substrate of the semiconductor device, these types of bonds may fail during operation of the semiconductor device.

In view of the potential for failure of the flip-chip or TAB electrical connections in chip-scale packages, chip-scale packages that include more flexible electrical connections, such as wire bonds, were developed. An exemplary chip-scale package that includes such flexible electrical connections is disclosed in U.S. Pat. No. 5,685,885 (hereinafter "the '885 Patent"), issued to Khandros et al. on Nov. 11, 1997. The chip-scale package of the '885 Patent may be assembled by orienting and disposing a sheet of interposer material over a wafer including a plurality of semiconductor devices thereon. The bond pads of the semiconductor devices may then be wire-bonded or otherwise flexibly bonded to corresponding contacts of the interposer. The wafer and interposer sheet may then be simultaneously singulated to separate individual semiconductor device packages from each other. The method and devices of the '885 Patent are, however, somewhat undesirable. The package of the '885 Patent includes a semiconductor device, a flexible, sheet-like dielectric interposer, and a substrate. Thus, the likelihood of failure of the semiconductor device is undesirably high. Moreover, the interposer of the package of the '885 Patent may include circuitry thereon to reroute electrical signals to and from the bond pads of the semiconductor device. These circuits may undesirably alter the electrical characteristics of signals transmitted through the bond pads.

Following packaging, the packaged semiconductor devices may be retested or otherwise processed to ensure that no damage occurred during packaging. The testing of individual packaged semiconductor devices is, however, somewhat undesirable since each package must be individually aligned with such testing or probing equipment.

Accordingly, there is a need for a semiconductor packaging process that facilitates testing, probing, and burn-in of semiconductor devices without requiring the alignment of individual semiconductor devices and by which a plurality of reliable chip-scale packages may be substantially simultaneously assembled. An efficient chip-scale packaging process with a reduced incidence of semiconductor device failure is also needed. There is a further need for chip-scale packaged semiconductor devices that consume about the same amount of real estate as the semiconductor devices thereof and that withstand repeated exposure to the operating conditions of the semiconductor device.

SUMMARY OF THE INVENTION

A carrier substrate according to the present invention, which is also referred to herein as a semiconductor substrate or simply as a carrier, is comprised of a semiconductor material and includes apertures defined substantially through the semiconductor material. The apertures of the carrier substrate are alignable with or may otherwise be positioned to communicate with corresponding bond pads of a semiconductor device to be secured to the carrier substrate. Any of the exposed surfaces of the carrier substrate may be covered with insulative material.

Conductive material may be disposed within and substantially fill the apertures so as to facilitate the transmission of signals to and from the bond pads of the semiconductor device through the carrier substrate. Alternatively, the apertures of the carrier substrate may be lined with conductive material by known metallization processes, such that a hollow portion may remain within the apertures. The hollow portion may be subsequently filled with a conductive bump material, such as solder. When the apertures are substantially filled with conductive material, an aperture and the conductive material therein collectively define an electrically conductive via, which is also referred to herein as a via for simplicity, through the carrier substrate.

The carrier substrate may also include conductive traces extending substantially laterally from selected ones of the electrically conductive vias. Preferably, each laterally extending conductive trace is carried by the carrier substrate proximate a surface opposite the surface to which a semiconductor device may be secured, which opposite surface is also referred to herein as a back side surface or simply as a back side of the carrier substrate. Such laterally extending conductive traces facilitate reconfiguration of the electrical paths through the carrier substrate.

Contacts, which communicate with corresponding vias, may be disposed proximate to and are preferably exposed at the back side of the carrier substrate. If the carrier substrate includes any conductive traces that extend from the electrically conductive vias, a contact may be disposed proximate an end of a conductive trace, opposite the via from which the conductive trace extends and with which the conductive trace communicates. Alternatively, a contact may be disposed along the length of a conductive trace.

A conductive bump, such as a solder bump or a solder ball, may be disposed adjacent each contact. Alternatively, if the apertures of the carrier substrate were lined with conductive material, a conductive bump may be disposed substantially over selected apertures and permitted to substantially fill any remaining hollow portion of the apertures by capillary action or wicking.

The carrier substrate may also include insulative material on the back side thereof. The insulative material may be grown onto or deposited on the back side of the carrier substrate. If insulative material is disposed on the back side of the carrier substrate, the contacts or conductive bumps are preferably exposed therethrough.

When the carrier substrate is employed in a chip-scale package, a semiconductor device is invertedly disposed over the carrier substrate such that bond pads on the active surface of the semiconductor device substantially align with corresponding vias of the carrier substrate. Thus, the vias through the carrier substrate communicate signals to and from the corresponding bond pads of the semiconductor device. The carrier substrate and the semiconductor device may be secured to one another, at least in part, by bonding the conductive material of the vias to the material of the bond pads.

Alternatively, or in combination with bonds between the conductive material of the carrier substrate and bond pads of the semiconductor device, an intermediate layer may be disposed between the semiconductor device and the carrier substrate to secure the semiconductor device to the carrier substrate. Preferably, such an intermediate layer comprises an adhesive material securable to both the active surface of the semiconductor device and a surface of the carrier substrate.

In a preferred embodiment of the method of the present invention, apertures are defined through a semiconductor wafer, such as a silicon wafer, which is referred to herein as a substrate wafer and may also be referred to as a first wafer. Preferably, the locations of the apertures of the carrier substrate or substrate wafer correspond substantially to bond pad locations of semiconductor devices fabricated on a wafer including a plurality of semiconductor devices, which wafer is referred to herein as a semiconductor device wafer and may also be referred to as a second wafer. The apertures through the carrier substrate or substrate wafer may be defined by known processes, such as by laser drilling or by masking and etching.

The carrier substrate or substrate wafer is aligned with the semiconductor device or semiconductor device wafer so that corresponding apertures of the carrier substrate or substrate wafer and bond pads of the semiconductor device or semiconductor device wafer are substantially aligned with one another. A polymeric material or an adhesive material may be disposed on either an active surface of the semiconductor device or semiconductor device wafer or on a surface of the carrier substrate or substrate wafer to be disposed adjacent the semiconductor device or semiconductor device wafer. The semiconductor device or semiconductor device wafer and the carrier substrate or substrate wafer are then disposed adjacent one another.

A layer of insulative material may be grown or disposed on any exposed surfaces of the carrier substrate or substrate wafer by known processes, such as by thermal oxidation techniques or chemical vapor deposition techniques. The insulative material may be disposed on the carrier substrate or substrate wafer either prior to or after assembly thereof with the semiconductor device or semiconductor device wafer.

Conductive material may be disposed in each of the apertures to define vias through the carrier substrate or substrate wafer. As conductive material is disposed within each of the apertures, the conductive material and the material of the bond pad exposed to the aperture may diffuse and thereby at least partially secure the semiconductor device wafer and the substrate wafer to one another.

Any laterally extending conductive traces may be fabricated on the back side of the substrate wafer. Known techniques, such as metallization processes, masking processes, and etching processes, may be employed to fabricate these conductive traces.

Contact pads comprising under-bump metallurgy ("UBM") or ball-limiting metallurgy ("BLM"), which are referred to herein as contacts for simplicity, may be fabricated on the back side of the substrate wafer. Preferably, each of these contacts correspond to and communicate with a via of the carrier substrate or substrate wafer. The contacts may be fabricated by known processes, such as by known metallization, masking, and etching processes. A conductive bump, such as a solder bump or a solder ball, may be disposed on each of the contacts by known processes.

An assembly that includes the semiconductor device wafer and the substrate wafer may be singulated by known processes. Upon singulation of individual semiconductor devices from the semiconductor device wafer and the substantially simultaneous singulation of the substrate wafer, individual chip-scale packages are separated from one another.

Other features and advantages of the present invention will become apparent to those of skill in the art through a consideration of the ensuing description, the accompanying drawings, and the appended claims.

DETAILED DESCRIPTION OF THE PREFERRED EMBODIMENTS

Figure 1:
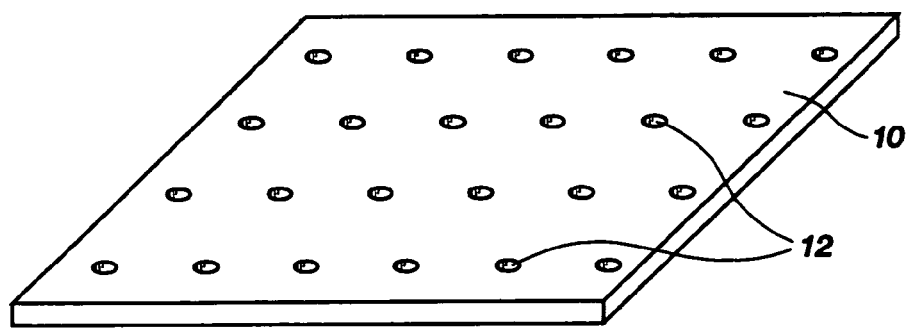
FIG. 1 is a perspective view of a carrier substrate according to the present invention.

With reference to FIG. 1, a carrier substrate 10, which is also referred to herein as a semiconductor substrate or simply as a carrier, is illustrated. Carrier substrate 10 is a substantially planar structure that may be fabricated from a semiconductor material, such as silicon. An array of apertures 12 is defined through carrier substrate 10. Preferably, apertures 12 correspond substantially to the bond pads 16 (see FIG. 2A) of a semiconductor device 14 to be assembled with carrier substrate 10.

Figure 2:
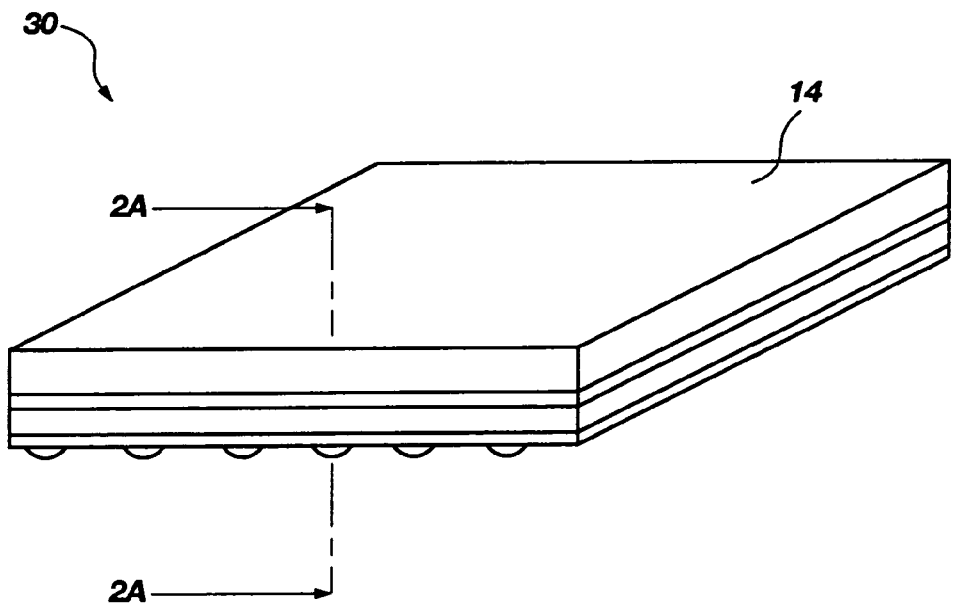
FIG. 2 is a perspective view of a chip-scale package according to the present invention.
Figure 2A:
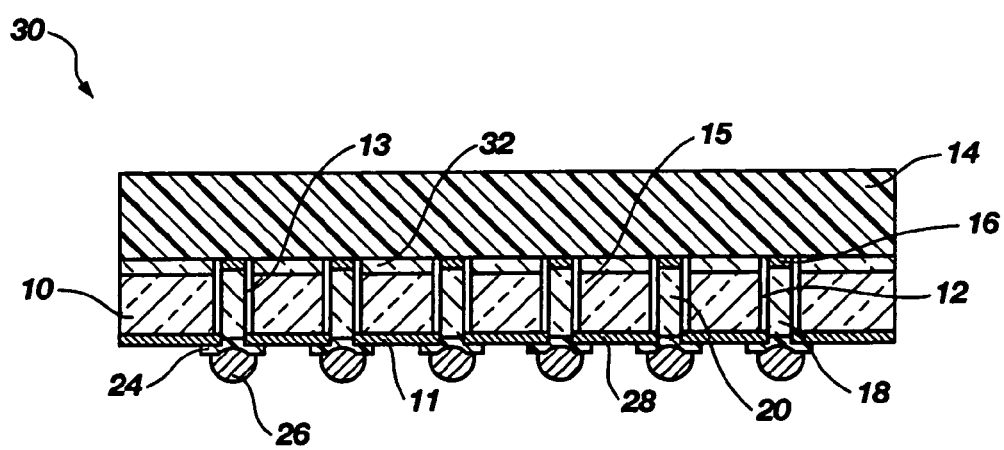
FIG. 2A is a cross-section taken along line 2A-2A of FIG. 2.

Turning to FIG. 2A, which illustrates a chip-scale package 30 including carrier substrate 10 and an associated semiconductor device 14, carrier substrate 10 may also include a quantity of conductive material 18 in each of apertures 12. Each aperture 12, which is coated with an insulative layer 13, and the conductive material 18 therein collectively define an electrically conductive via 20 that extends substantially through carrier substrate 10 and through which signals may be communicated to or from a corresponding bond pad 16.

Figure 7:
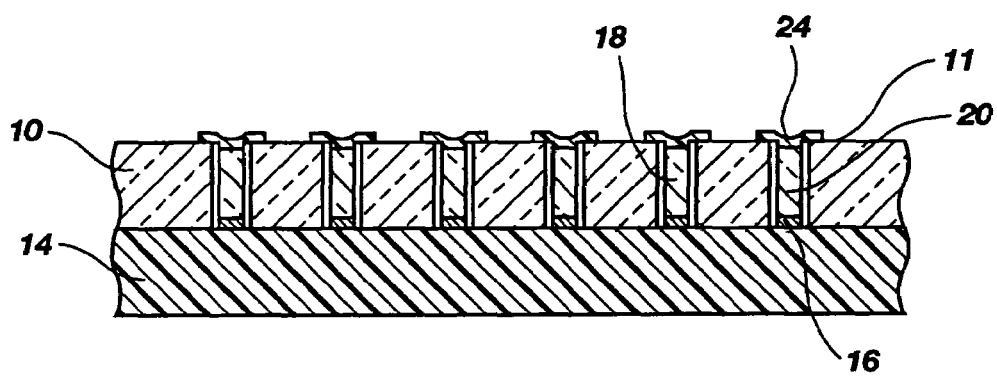
FIG. 7 is a schematic cross-sectional representation of the fabrication of contacts in communication with the electrically conductive vias of FIG. 6.
Figure 7A:
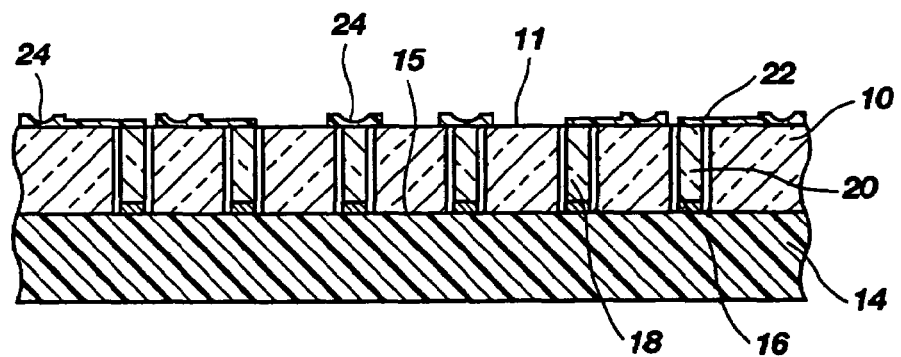
FIG. 7A is a schematic cross-sectional representation of the fabrication of laterally extending conductive traces and their corresponding contacts in communication with selected ones of the electrically conductive vias of FIG. 6.

As shown in FIG. 7A, carrier substrate 10 may also include conductive traces 22 extending laterally from vias 20. As illustrated, conductive traces 22 are carried by carrier substrate 10 on or proximate a back side 11 thereof. Alternatively, conductive traces 22 may extend internally through carrier substrate 10.

Contacts 24, such as the ball-limiting metallurgy structures or under-bump metallurgy structures known in the art, may be disposed in communication with vias 20 and carried by carrier substrate 10 on or proximate back side 11. If carrier substrate 10 includes any laterally extending conductive traces 22, contacts 24 may be disposed adjacent such conductive traces 22. Referring again to FIG. 2A, contacts 24 that communicate with vias 20 that do not include laterally extending conductive traces 22 may be disposed adjacent such vias 20. A conductive bump 26, such as a solder bump or a solder ball, may be disposed adjacent each contact 24.

Carrier substrate 10 may also include insulative material 28 on back side 11. Insulative material 28 may be disposed in a layer that substantially covers back side 11. The presence of insulative material 28 on back side 11 is especially preferred if carrier substrate 10 includes any conductive traces 22 exposed at back side 11. If carrier substrate 10 includes insulative material 28, insulative layer 13 coating apertures 12, vias 20 within apertures 12, contacts 24, or conductive bumps 26 are preferably exposed through insulative material 28.

FIGS. 2 and 2A illustrate a chip-scale package 30 that includes a semiconductor device 14 invertedly oriented and disposed over carrier substrate 10. Preferably, semiconductor device 14 is a flip-chip type semiconductor device that includes bond pads 16 disposed over an active surface 15 thereof in an array. Bond pads 16 of semiconductor device 14 align substantially with apertures 12 of carrier substrate 10, thereby facilitating communication between each bond pad 16 and its corresponding via 20. An intermediate layer 32 may be disposed between semiconductor device 14 and carrier substrate 10. If chip-scale package 30 includes such an intermediate layer 32, bond pads 16 and their corresponding vias 20 are preferably exposed or otherwise communicate with one another through intermediate layer 32.

Turning now to FIGS. 3-9, a preferred embodiment of a method of fabricating chip-scale packages 30 in accordance with the method of the present invention is illustrated. The features of carrier substrate 10 and a chip-scale package 30 including carrier substrate 10 are also described in greater detail with reference to FIGS. 3-9.

Figure 3:
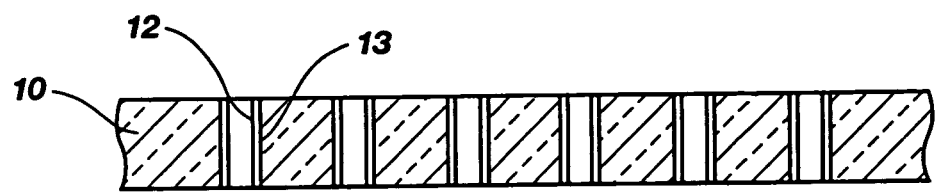
FIG. 3 is a schematic cross-sectional representation of a carrier substrate having apertures formed therethrough in accordance with the method of the present invention.

FIG. 3 illustrates a carrier substrate 10 including an array of apertures 12. Carrier substrate 10 may be fabricated from a semiconductor material, such as silicon, gallium arsenide, silicon on glass ("SOG"), silicon on insulator ("SOI"), or silicon on sapphire ("SOS"). Carrier substrate 10 may comprise a substantially chip-sized structure or may be part of a larger structure, such as a wafer (see FIG. 4B). Preferably, carrier substrate 10 is fabricated from a silicon wafer.

Each aperture 12, which is lined with an insulative layer 13, preferably extends substantially through carrier substrate 10. The location of each aperture 12 preferably corresponds substantially to a location of a bond pad 16 (see FIG. 4) of a semiconductor device 14 to be assembled with carrier substrate 10. Apertures 12 may be defined through carrier substrate 10 by known techniques, such as by known laser machining processes, which are also referred to herein as laser drilling techniques, or by known patterning processes (e.g., masking and etching). Insulative layer 13 may be formed by known processes, such as by employing known oxidation techniques to oxidize the surfaces of apertures 12. Apertures 12 may be defined through carrier substrate 10 and lined with insulative layer 13 either before or after the assembly of carrier substrate 10 with semiconductor device 14.

Figure 4:
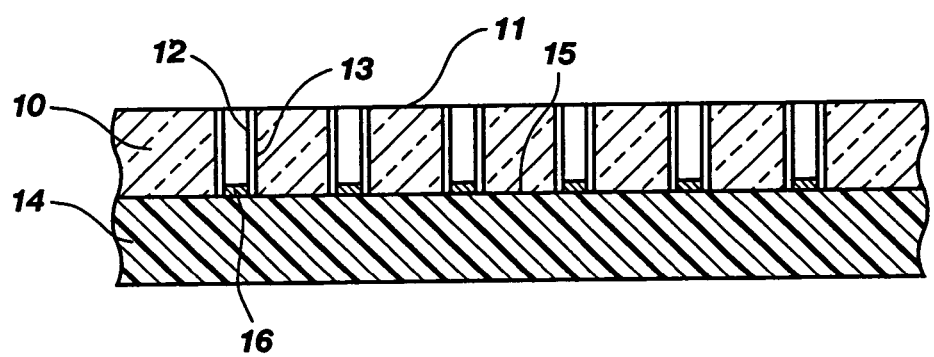
FIG. 4 is a schematic cross-sectional representation of the relative alignment and assembly of the carrier substrate of FIG. 3 with a semiconductor device.

Referring to FIG. 4, carrier substrate 10 may be disposed over semiconductor device 14 so as to substantially align each bond pad 16 thereof with its corresponding aperture 12 of carrier substrate 10. Known processes may be employed to align semiconductor device 14 and carrier substrate 10. Preferably, semiconductor device 14 and carrier substrate 10 have substantially the same, or at least similar, coefficients of thermal expansion so as to maintain the integrity of a chip-scale package including semiconductor device 14 and carrier substrate 10 during the operation thereof. The thicknesses of carrier substrate 10 and semiconductor device 14 are also preferably similar, and may be substantially the same. The thickness of semiconductor device 14 may, however, be greater than that of carrier substrate 10 since semiconductor device 14 includes integrated circuit devices that have been fabricated or built-up on active surface 15 thereof.

Figure 4A:
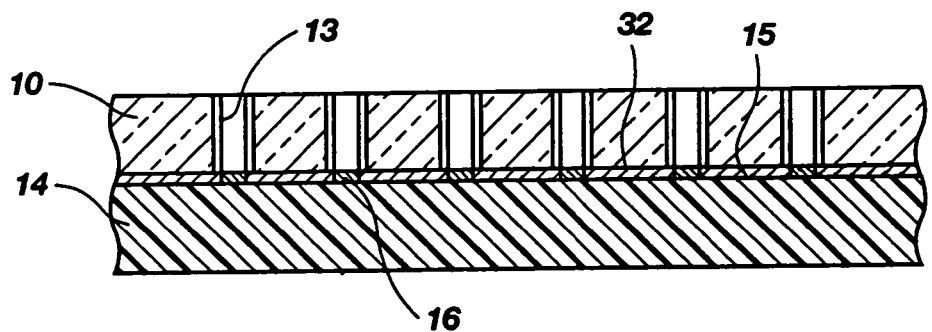
FIG. 4A is a schematic cross-sectional representation of the relative alignment and assembly of the carrier substrate of FIG. 3 with a semiconductor device and a quantity of polymeric or adhesive material disposed between the carrier substrate and the semiconductor device.

As shown in FIG. 4A, an intermediate layer 32 may be disposed between semiconductor device 14 and carrier substrate 10. Intermediate layer 32 may include a polymeric material or an adhesive material, such as a polyimide, that adheres semiconductor device 14 and carrier substrate 10 to one another. Intermediate layer 32 may also insulate structures exposed at active surface 15 of semiconductor device 14 from carrier substrate 10 or structures thereof. Bond pads 16 are preferably exposed through intermediate layer 32 so as to facilitate the communication of signals to and from bond pads 16 through intermediate layer 32 and through vias 20 (see FIG. 2A). Intermediate layer 32 may be disposed on active surface 15 of semiconductor device 14 or on a surface of carrier substrate 10 by known processes, such as by spin-on techniques or other known processes that may be used to fabricate or form a layer with a substantially planar surface and having a substantially uniform thickness over the surface of a semiconductor device.

Figure 4B:
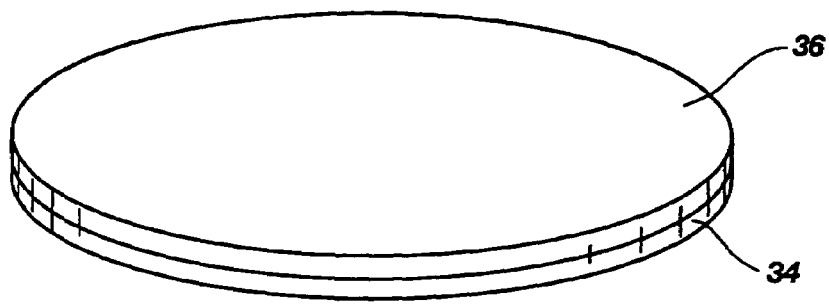
FIG. 4B is a perspective view illustrating the assembly of a wafer including a plurality of semiconductor devices with a substrate wafer.

With reference to FIG. 4B, carrier substrate 10 and semiconductor device 14 may be assembled on a wafer scale. Stated another way, a wafer 34 including a plurality of semiconductor devices 14 (see FIGS. 4 and 4A), which is referred to herein as a semiconductor device wafer and may also be referred to as a second wafer, may be assembled with another wafer 36, which is referred to herein as a substrate wafer and may also be referred to as a first wafer, from which the carrier substrate 10 of each chip-scale package 30 is defined.

Figure 5:
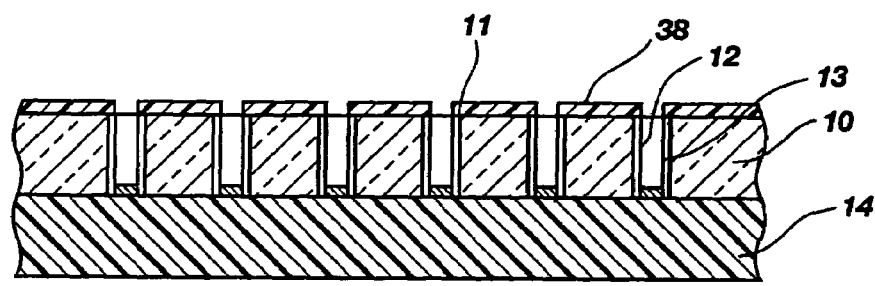
FIG. 5 is a schematic cross-sectional representation of the formation or disposal of an insulative layer over at least the back side of the carrier substrate.

As shown in FIG. 5, an insulative layer 38 may be formed on back side 11 of carrier substrate 10. Insulative layer 38 may be formed by known processes, such as by growing a thermal oxide (e.g., a silicon oxide) layer on back side 11 and on any other exposed surfaces of carrier substrate 10. For example, an insulative layer 38 comprising thermal oxide may be grown during a furnacing process, such as during a thermal anneal of conductive material 18 (see FIG. 6) to the portions of carrier substrate 10 exposed in apertures 12. Alternatively, a layer 38 of electrically insulative material may be deposited onto back side 11 and any other exposed surfaces of carrier substrate 10 by known techniques, such as chemical vapor deposition ("CVD") processes. If insulative layer 38 is deposited, electrically insulative materials such as tetraethylorthosilicate ("TEOS"), silicon nitride, or glass (e.g., borophosphosilicate glass ("BPSG"), phosphosilicate glass ("PSG"), or borosilicate glass ("BSG")) may be employed. Insulative layer 38 may be formed on carrier substrate 10 either prior to or after the assembly of carrier substrate 10 and semiconductor device 14. The surfaces of carrier substrate 10 on which insulative layer 38 is present depends, at least in part, on the fabrication method and on whether or not carrier substrate 10 has been assembled with semiconductor device 14.

If the removal of portions of insulative layer 38 from carrier substrate 10 is desired, known processes, such as mask and etch techniques, may be employed. For example, it may be desirable to remove insulative layer 38 from the surfaces of apertures 12 from bond pads 16, or from electrically conductive vias 20. Thus, a mask including openings or apertures therethrough to expose apertures 12 would be fabricated and employed in combination with an etchant that selectively etches the material of insulative layer over the material of bond pads 16 or the semiconductor material of carrier substrate 10.

Figure 6:
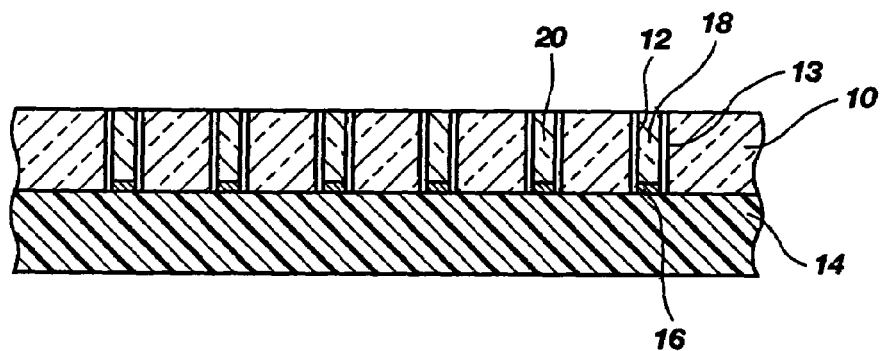
FIG. 6 is a schematic cross-sectional representation of the disposal of conductive material within the apertures of the carrier substrate of FIG. 4 or FIG. 5 to form electrically conductive vias.

Referring to FIG. 6, an assembly including semiconductor device 14 and carrier substrate 10 is shown. Apertures 12 are lined with a layer 13 of insulative material and substantially filled with conductive material 18. Insulative layer 13 may be formed by known processes, such as by oxidizing surfaces of apertures 12. Conductive material 18 may be disposed in apertures 12 by known processes, such as by known physical vapor deposition ("PVD") processes (e.g., sputtering) or by chemical vapor deposition ("CVD") processes. Any excess conductive material 18 may be removed from back side 11 by known processes, such as by known etching techniques or by known planarization processes (e.g., chemical-mechanical planarization ("CMP")).

Preferably, as conductive material 18 is disposed in apertures 12, conductive material 18 contacts bond pads 16 of semiconductor device 14. As conductive material 18 or via material may adhere to bond pads 16, conductive material 18 may diffuse, thereby forming a diffusion region or contact between conductive material 18 and the corresponding bond pad 16, the disposal of conductive material 18 within apertures 12 may at least partially secure carrier substrate 10 and semiconductor device 14 to one another.

Figure 6A:
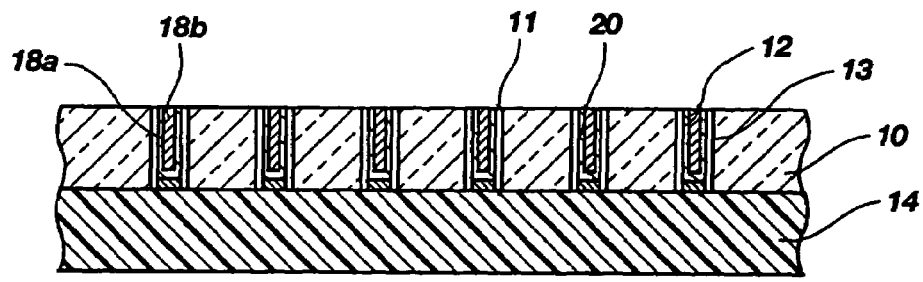
FIG. 6A is a schematic cross-sectional representation of the disposal of two layers of conductive material within the apertures of the carrier substrate of FIG. 4 or FIG. 5 to form electrically conductive vias.

Referring to FIG. 6A, it may be desirable to dispose conductive material 18 in two layers 18a and 18b, a first layer 18a of which includes a barrier-type material that reduces contact resistance and that may reduce or prevent diffusion between the semiconductor material of carrier substrate 10 and the conductive material of the second layer 18b, which may cause electrical shorts between adjacent vias 20 or increase the resistance of a via 20. Barrier materials that are known in the art, such as metal silicides, and that are compatible with both the semiconductor material of carrier substrate 10 and the conductive material of second layer 18b may be employed. Such materials are particularly useful to prevent conductive material from spiking into the adjacent semiconductor material and, thereby, potentially causing electrical shorts between adjacent vias 20. For example, if the conductive material of second layer 18b comprises titanium, the barrier material of first layer 18a may comprise titanium silicide. Such materials may be deposited by known processes, such as chemical vapor deposition or physical vapor deposition. Preferably, selective deposition (i.e., self-aligned silicide or "salicide") processes are employed, wherein the barrier material is disposed only on exposed regions of the semiconductor material, and not on an oxide coating thereover. The conductive material of second layer 18b may then be deposited over first layer 18a of barrier material by known processes, such as chemical vapor deposition or physical vapor deposition.

Conductive material 18 may be annealed to insulative layer 13 by known processes, such as by thermal anneal techniques.

Any undesired regions of conductive material 18 (e.g., of either of first and second layers 18a or 18b) that remain on back side 11 may be removed by known processes. For example, known planarization techniques, such as chemical-mechanical planarization or chemical-mechanical polishing, may be employed to substantially completely remove the conductive material 18 from back side 11. Alternatively, if the selective removal of any portion of conductive material 18 from back side 11 is desired, known patterning processes, such as mask and etch techniques, may be employed to pattern conductive material 18.

With reference to FIG. 7A, conductive traces 22 may be fabricated to reconfigure the footprint of contacts 24 on back side 11 relative to the footprint of bond pads 16 on active surface 15 of semiconductor device 14. Thus, conductive traces 22 preferably extend substantially laterally from their corresponding vias 20 and may be carried substantially internally by carrier substrate 10 or exposed at the back side 11 thereof. Conductive traces 22 may be fabricated by known processes, such as by depositing one or more layers of conductive material onto a surface of carrier substrate 10 and patterning the layer or layers of conductive material. Alternatively, conductive traces 22 may be defined from first and second layers 18a and/or 18b during patterning of these layers.

Referring to FIG. 7, contacts 24, which communicate with bond pads 16 by means of vias 20, may be carried by back side 11 of carrier substrate 10. Contacts 24 are preferably fabricated by known processes (e.g., fabricating the layers by PVD and patterning the layers by mask and etch processes), such as those employed to fabricate under-bump metallurgy ("UBM") or ball-limiting metallurgy ("BLM") structures. Accordingly, each contact 24 may include an adhesion layer adjacent the conductive material 18 of its corresponding via 20, a solder wetting layer adjacent the adhesion layer, and an exposed, substantially nonoxidizable protective layer (e.g., gold or other noble metal) adjacent the solder wetting layer.

Alternatively, if conductive material 18 (or the material of second layer 18b) is a solder-wettable material, contacts 24 may be patterned from the conductive material 18 disposed over back side 11 of carrier substrate 10. Known processes, such as masking and etching, may be employed to define contacts 24 from conductive material 18.

Figure 8:
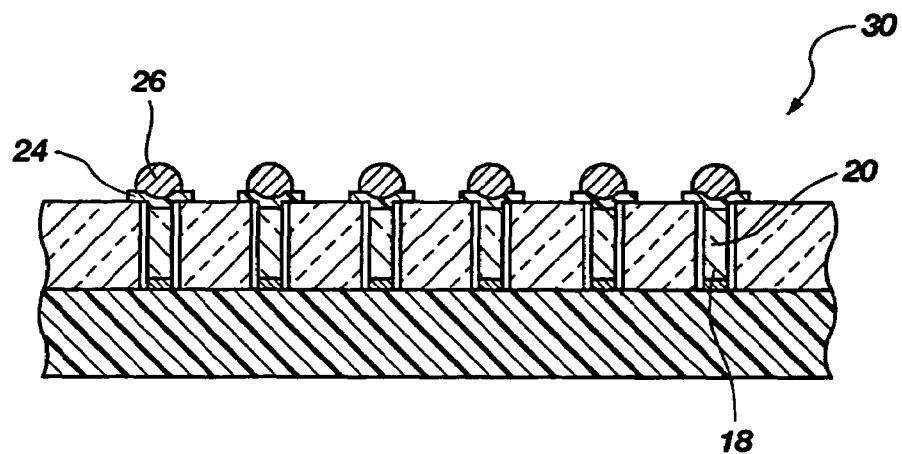
FIG. 8 is a schematic cross-sectional representation of the disposal of conductive bumps adjacent the contacts of FIG. 7.

Referring now to FIG. 8, conductive bumps 26 may be disposed adjacent selected contacts 24. An exemplary conductive bump 26 material that may be employed with the chip-scale package 30 of the present invention is solder. The material of a conductive bump 26 preferably bonds or adheres to an adjacent contact 24 and, thereby, facilitates electrical communication between conductive bump 26 and contact 24. Alternatively, conductive bumps 26 may be disposed directly adjacent to conductive material 18 of vias 20.

Figure 6B:
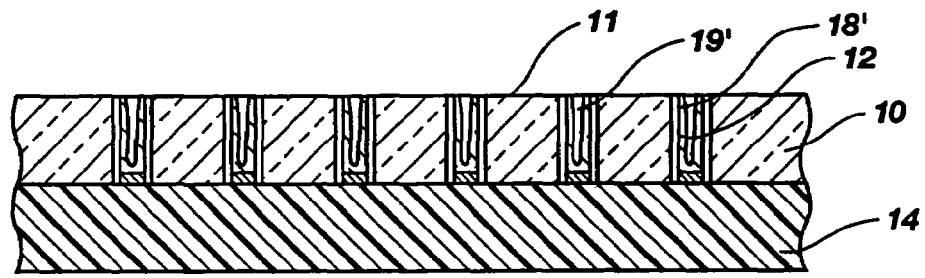
FIG. 6B is a schematic cross-sectional representation of the lining of the apertures of the carrier substrate of FIG. 4 or FIG. 5 with conductive material.

With reference to FIG. 6B, as an alternative to substantially filling apertures 12 with conductive material, conductive material may be disposed in apertures 12 in one or more relatively thin layers 18', such that hollow or open regions 19' remain in at least some of apertures 12. Preferably, the conductive material of layer 18' is wettable by a conductive bump material, such as molten solder. A layer of barrier-type material may be disposed between layer 18' and the adjacent surface of carrier substrate 10 to adhere the conductive material to carrier substrate 10 and to prevent diffusion of the semiconductor material of carrier substrate 10 with layer 18'.

If layer 18' includes a barrier material, the barrier material may be disposed on the insulative layer 13-lined surfaces of apertures 12 by known processes, such as by chemical vapor deposition or physical vapor deposition. The wettable conductive material of layer 18' may also be disposed over the insulative layer 13-lined surface of each aperture 12 by known processes, such as chemical vapor deposition or physical vapor deposition. Barrier material or conductive material may be removed from back side 11 of carrier substrate 10 by known processes, such as by known patterning or planarization techniques.

Figure 8A:
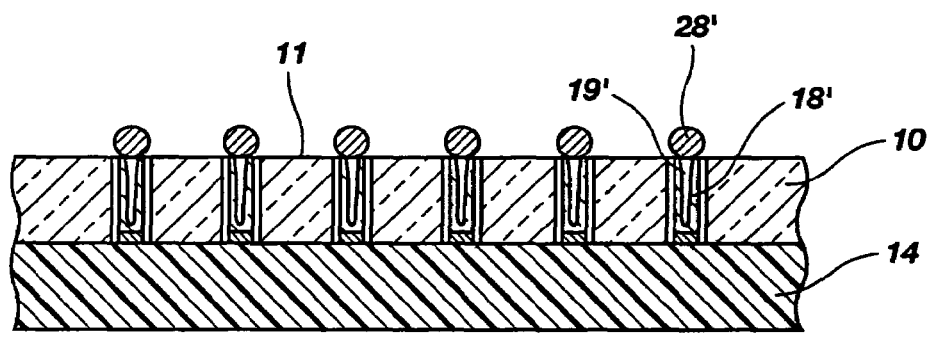
FIGS. 8A and 8B are schematic cross-sectional representations of the disposal of conductive bumps within the lined apertures of the carrier substrate of FIG. 6B.
Figure 8B:
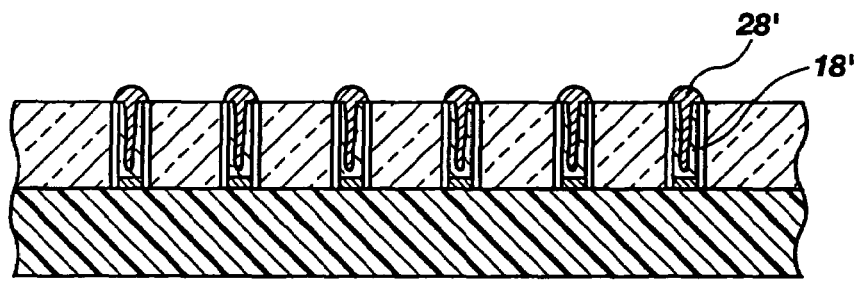

As shown in FIGS. 8A and 8B, a conductive bump 28' material, such as solder, may be disposed adjacent conductive layer 18'. If layer 18' includes a material that is wettable by the conductive bump 28' material employed, the conductive bump may be drawn into hollow region 19' by capillary action, or "wicking."

As the chip-scale packages 30 of the present invention may be fabricated on a wafer scale, as depicted in FIG. 4B, testing, probing, or burn-in of each of the semiconductor devices 14 of semiconductor device wafer 34 can be performed after packaging, but while the semiconductor devices are still in wafer form. Thus, the packaging method of the present invention eliminates the need to individually align individually packaged semiconductor devices with test equipment.

Figure 9:
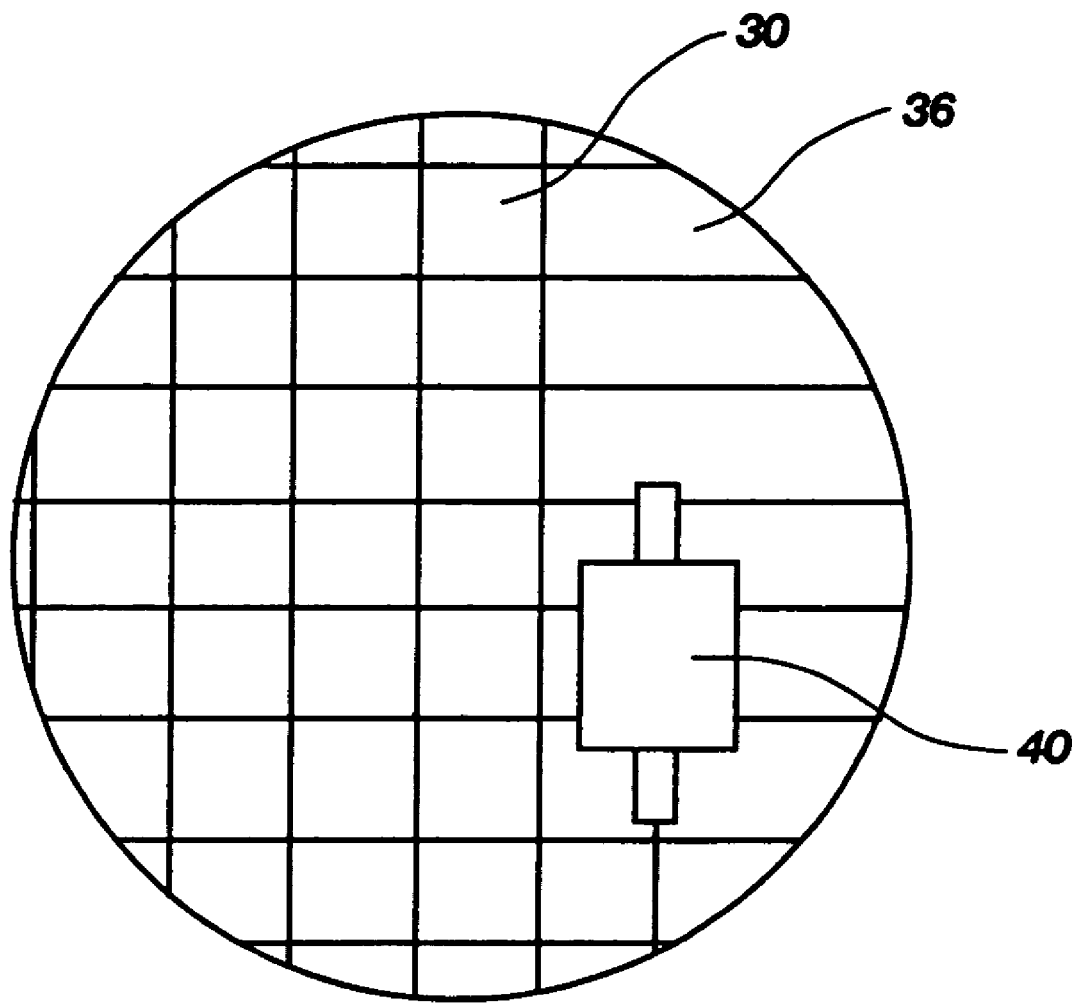
FIG. 9 is a schematic representation of the singulation of chip-scale packages from an assembled semiconductor device wafer and substrate wafer.

Turning now to FIG. 9, individual chip-scale packages 30 may be singulated from the assembly of semiconductor device wafer 34 (not shown) and substrate wafer 36 by known singulation processes, such as by the use of a wafer saw 40.

Although the foregoing description contains many specifics and examples, these should not be construed as limiting the scope of the present invention, but merely as providing illustrations of some of the presently preferred embodiments. Similarly, other embodiments of the invention may be devised which do not depart from the spirit or scope of the present invention. The scope of this invention is, therefore, indicated and limited only by the appended claims and their legal equivalents, rather than by the foregoing description. All additions, deletions and modifications to the invention as disclosed herein and which fall within the meaning of the claims are to be embraced within their scope.

What is claimed is:

1. A method of fabricating a chip-scale package, comprising:
    defining at least one aperture through a semiconductor substrate, the at least one aperture including a first opening at a first surface of the semiconductor substrate and a second opening at an opposite, second surface of the semiconductor substrate;
    assembling the semiconductor substrate with a semiconductor device, including positioning the first surface of the semiconductor substrate adjacent to the semiconductor device and aligning the first opening of the at least one aperture with at least one bond pad of the semiconductor device during the act of assembling; and
    after assembling the semiconductor substrate with the semiconductor device, substantially filling the at least one aperture with conductive material through the second opening of the aperture, the conductive material contacting the at least one bond pad during the act of substantially filling.

2. The method of claim 1, wherein defining the at least one aperture comprises laser drilling.

3. The method of claim 1, wherein defining the at least one aperture comprises etching.

4. The method of claim 1, wherein assembling comprises substantially aligning a first periphery of a first wafer including the semiconductor device with a second periphery of a second wafer comprising the semiconductor substrate.

5. The method of claim 4, further comprising singulating the semiconductor device from the first wafer and substantially simultaneously singulating a corresponding portion of the semiconductor substrate from the second wafer.

6. The method of claim 1, further comprising securing the semiconductor device to the semiconductor substrate.

7. The method of claim 6, wherein securing comprises disposing an adhesive material between the semiconductor device and the semiconductor substrate.

8. The method of claim 6, wherein securing comprises bonding the conductive material to the at least one bond pad.

9. The method of claim 1, further comprising disposing an insulative material on a surface of the semiconductor substrate.

10. The method of claim 9, wherein disposing the insulative material comprises growing an oxide on the surface.

11. The method of claim 9, wherein disposing the insulative material comprises forming an insulative layer on the surface.

12. The method of claim 9, wherein disposing the insulative material comprises disposing the insulative material on a surface of the semiconductor substrate opposite the semiconductor device.

13. The method of claim 1, further comprising fabricating at least one contact proximate a surface of the semiconductor substrate and in communication with the conductive material.

14. The method of claim 1, further comprising disposing a conductive bump in communication with the conductive material.

15. The method of claim 14, wherein disposing the conductive bump comprises disposing a solder ball in communication with the conductive material.

16. The method of claim 1, further comprising fabricating a conductive trace extending substantially laterally from the conductive material.

17. A method for simultaneously forming a plurality of chip-scale packages, comprising:
    providing a substrate comprising a plurality of carriers, each carrier of the plurality of carriers including a plurality of apertures formed therethrough, each aperture of the plurality of apertures including a first opening at a first surface of the substrate and a second opening at an opposite, second surface of the substrate;
    assembling a plurality of semiconductor devices with the substrate, adjacent to the first surface of the substrate, with each semiconductor device of the plurality positioned adjacent to a carrier of the plurality of carriers, bond pads of each semiconductor device being substantially aligned with the first openings of the plurality of apertures of the carrier; and
    after assembling the plurality of semiconductor devices with the substrate, introducing unconsolidated conductive material into each aperture of the plurality of apertures through the second openings so as to substantially fill each aperture and to at least partially form a via therein.

18. The method of claim 17, wherein providing comprises providing the substrate with a conductive trace extending from at least one aperture of the plurality of apertures.

19. The method of claim 18, further comprising forming at least one of a contact pad and a conductive structure in communication with the conductive trace.

20. The method of claim 17, wherein assembling comprises assembling a plurality of separate semiconductor devices with the substrate.

21. The method of claim 17, wherein assembling comprises assembling another substrate upon which the plurality of semiconductor devices are carried with the substrate.

22. The method of claim 17, further comprising forming at least one of a contact pad and a conductive structure on at least some of the vias.

23. The method of claim 17, further comprising severing adjacent assemblies of semiconductor devices and carriers from one another.

24. A method for fabricating a chip-scale package, comprising:
    defining at least one aperture through a semiconductor substrate, the at least one aperture including a first opening at a first surface of the semiconductor substrate and a second opening at an opposite, second surface of the semiconductor substrate;
    substantially aligning a first periphery of a first wafer including a semiconductor device with a second periphery of a second wafer comprising the semiconductor substrate to align at least one bond pad of the semiconductor device with the first opening of the at least one aperture; and
    after substantially aligning the first periphery with the second periphery, substantially filling the at least one aperture through the second opening with unconsolidated conductive material, the unconsolidated conductive material contacting the at least one bond pad.

25. The method of claim 24, further comprising singulating the semiconductor device from the first wafer and substantially simultaneously singulating a corresponding portion of the semiconductor substrate from the second wafer.

* * * * *